United States Patent [19]

Kraus

[11] 4,449,478
[45] May 22, 1984

[54] ARRANGEMENT FOR COATING SUBSTRATES BY VACUUM DEPOSITION

[75] Inventor: Thaddäus Kraus, Triesen, Switzerland

[73] Assignee: Balzers Aktiengesellschaft, Liechtenstein

[21] Appl. No.: 357,334

[22] Filed: Mar. 11, 1982

[30] Foreign Application Priority Data

Mar. 13, 1981 [CH] Switzerland .................. 1720/81

[51] Int. Cl.³ ............................................. C23C 13/08
[52] U.S. Cl. .................................. 118/720; 118/730; 118/726; 118/504; 427/255.5
[58] Field of Search ............... 118/720, 730, 721, 722, 118/500, 504, 729, 715; 427/251, 255.5

[56] References Cited

U.S. PATENT DOCUMENTS

| | | | |
|---|---|---|---|
| 3,636,916 | 1/1972 | Thelen et al. | 118/730 X |
| 4,222,345 | 9/1980 | Bergfelt et al. | 118/720 |
| 4,226,208 | 10/1980 | Nishida et al. | 118/730 X |
| 4,322,592 | 3/1982 | Martin | 118/730 X |
| 4,380,212 | 4/1983 | Kraus | 118/730 |

OTHER PUBLICATIONS

Dahke et al., "Semiconductor Wafer Dome For an Evaporator," *IBM Technical Disclosure Bulletin,* vol. 18, No. 7 p. 2171, Dec. 1975.

*Primary Examiner*—John D. Smith
*Assistant Examiner*—Bernard F. Plantz
*Attorney, Agent, or Firm*—McGlew and Tuttle

[57] ABSTRACT

An arrangement for coating substrates in an apparatus for vacuum deposition comprises a rotatable substrate holding structure in the form of a circular plate provided with holders for the substrates. The holders are arranged in circular rows around the axis of rotation of the plate so that the substrates held in the holder are arranged at axes such that those substrates in a single circular row have axes which intersect a single point along the axis of rotation of the plate. A vapor beam correction screen is mounted for rotation adjacent to the plate in an opposite direction about the same axis. A vapor beam correction screen is conformed in a stepwise manner to an even coating of spherical zones which have their center of curvature at the point of intersection of the substrate axes and are tangent to the poles of the respective substrates and cover the surface areas thereof.

2 Claims, 12 Drawing Figures $\emptyset = D_a / \cos \alpha$

ARRANGEMENT FOR COATING SUBSTRATES BY VACUUM DEPOSITION

FIELD AND BACKGROUND OF THE INVENTION

This invention relates in general to coating substrates by vapor deposition and in particular to a new and useful arrangement for coating substrates in an apparatus for vacuum deposition in which the substrates are held on a plate having holders arranged in holes such that their axis of rotation intersects on a point along the axis of rotation of the plate and wherein a vapor beam correction screen is located adjacent the plate and rotates in an opposite direction to the plate.

A substantially highly accurate uniformity and evenness in coating of spherical or planar surfaces, for example of optical lenses, can be obtained by vacuum deposition. That is, random variations of the beam intensity of the evaporative source which may occur during the coating operation affect the layer thickness very little and correspond to a numerical value in the order of 0.1% of the layer thickness.

Much greater deviations are caused by the inaccuracy of the structure supporting the substrates. Already deviations of ±0.3 mm for example, from a nominal value of 600 mm of the main radius of curvature of the spherical plate produce approximately the same variations in layer thickness as random variations in the beam intensity. However, with spherical plates obtained, for example, by drawing and punching from a 3 mm Cr-Ni steel sheet, such narrow tolerances can never be observed. As a rule, the deviations exceed more than tenfold the above mentioned values. It would be very expensive to produce sherical plates of larger thickness, having a satisfactory ridigity.

There is known a prior art arrangement for uniformly coating surfaces of revolution by vapor deposition in high vacuum, comprising a substrate holding structure rotatable about an axis, an evaporative source provided near the axis of rotation and a correction screen for the vapor beam, which is mounted close to the substrate holding structure and rotates about the same axis in opposite direction. To obtain a desired high accuracy in coating, this arrangement again requires substrate supports which are sufficiently rigid.

SUMMARY OF THE INVENTION

The invention provides an arrangement to obtain a maximum possible accuracy in coating at lower costs then heretofore.

Initially, some terms are to be clarified:

Under "evenness" of coating, it is understood that the layer thicknesses are equal at any distance from the substrate pole, on any substrate.

Under "uniformity" of coating, it is understood that the layer thicknesses are equal at equal distances from the substrate poles, on any substrate.

The "substrate pole" is the center of the surface area to be coated.

The "substrate axis" is a normal to the surface at the substrate pole.

The "evaporative source" is any device from which the vapor of the substance to be deposited on the substrates is emitted in vacuum.

The invention relates to an arrangement for coating substrates which, (in accordance with FIGS. 1 and 4) comprises a holding structure for supporting the substrates and rotating them about an axis of rotation. At least one evaporative source is provided near the axis of rotation and a correction screen for the vapor beams which is mounted for rotation in an opposite direction about the same axis, and extends near the substrates. The particular characterizing feature of the arrangement is that the supporting structure comprises a circular plate which is provided with holes and holders for the substrates arranged in circular rows about the axis of rotation in such a manner that the axes of substrates placed in a single circular row intersect at a point on the axis of rotation.

Since the supporting structure may now be designed as a flat plate instead of a spherical one, the great advantage is obtained, in addition to others, that the plate can be made in an economical manner from a material of lower density (below 4.5 kg/dm$^3$). Aside from light metals, electrographite is particularly suitable for this purpose, not only because of its low specific weight (1.7 kg/dm$^3$). That is, since higher temperatures frequently occur during coating, it must be taken into account that the strength of light metals considerably decreases with rising temperatures (above 250° C.), while the strength of graphite increases. Also, the expansion in length of graphite is about 10 times smaller than that of light metals.

Accordingly, it is an object of the invention to provide a substantially highly accurate uniformity and evenness in the coating of spherical or planar surfaces in an arrangement in which a plurality of circular rows are defined on a rotating plate, holders that hold the substrates so that their axes of rotation will intersect at a point along the axis of rotation of the plate and wherein the vapor beam correction screen is located between the evaporation source and the plate and is rotated in an opposite direction about the same axis.

A further object of the invention is to provide an arrangement for coating substrates which are simple in design, rugged in construction and economical to manufacture.

The various features of novelty which characterize the invention are pointed out with particularity in the claims annexed to and forming a part of this disclosure. For a better understanding of the invention, its operating advantages and specific objects attained by its uses, reference is made to the accompanying drawings and descriptive matter in which preferred embodiments of the invention are illustrated.

DESCRIPTION OF THE PREFERRED EMBODIMENTS

Figures 1, 1A:
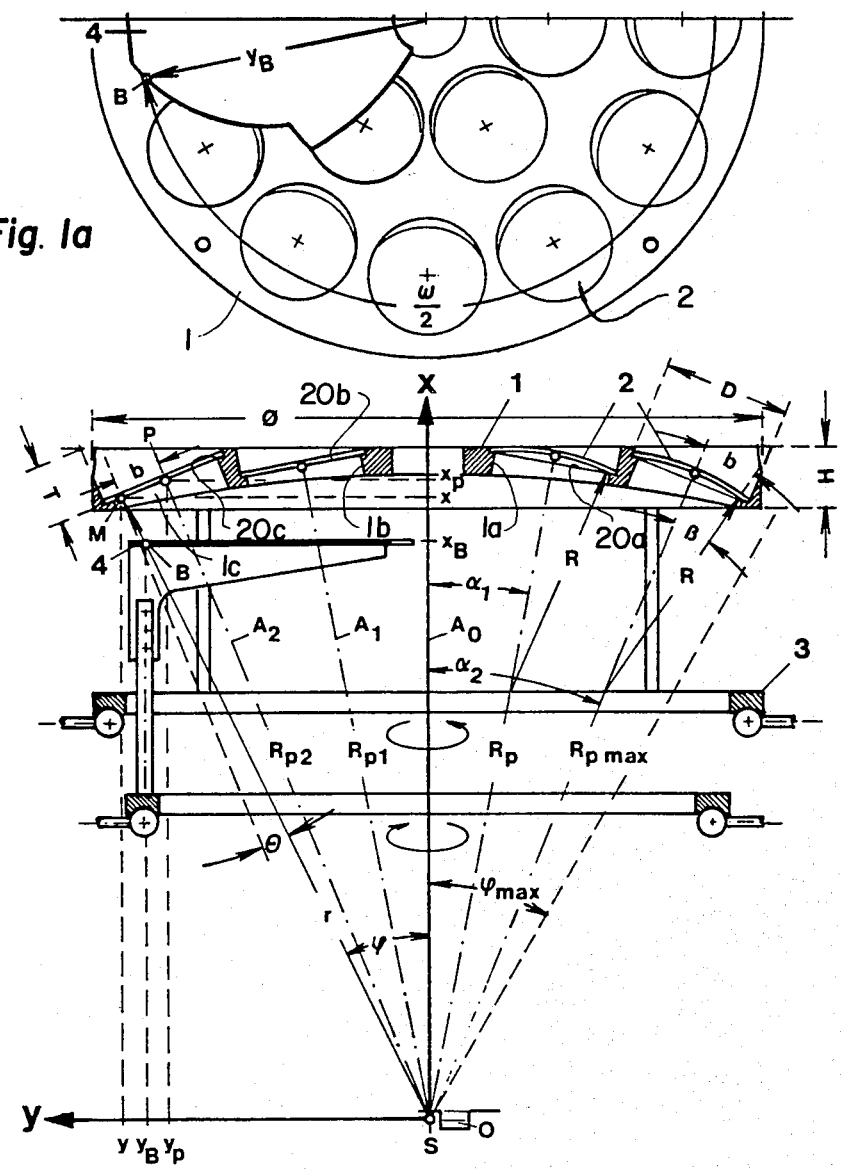
FIG. 1 is a vertical sectional view of a first embodiment of the invention permitting substantially uniform coatings of spherical, aspherical, or planar surfaces, for example of optical lenses and mirrors.

Referring to the drawings, in particular the invention embodied therein in FIG. 1, comprises an arrangement for coating substrates and an apparatus for vacuum deposition which comprises a rotatable substrate holding structure 1 which is arranged with means for supporting it for rotation about the axis $A_0$. At least one evaporative source 0 is provided in the proximity of the rotational axis $A_0$ and a vapor beam correction screen is mounted for rotation in an opposite direction about the same axis. The holding structure comprises a circular plate 1 provided with holes 1a, 1b, 1c having substrate holders 20a, 20b, 20c arranged in discreet circular rows such that their axes lies along an axis of rotation which intersects the axis of rotation of the plate 1 at the location S.

The circular plate 1 shown in FIG. 1 is provided with thruholes 1a, 1b and 1c which are arranged in circular rows and provided with counterbore seats or shoulders 20a, 20b, and 20c for receiving substrates 2 in a position in which the axes $A_1$, $A_2$ etc. of the substrates intersect at a point S on the axis $A_0$ of the circular plate, at a distance approximately corresponding to the diameter $\emptyset$ of the circular plate.

To avoid a disadvantageous flection, circular plates are employed having a thickness H of more than 1/50 of the circular plate diamter $\emptyset$, if made of a light metal, and more than 1/25 of that diameter, if made of electrographite.

The depths of seat T differ from one circular row of holes to the other, but they are identical from hole to hole in a circular row. Depth of seat and thickness of plate are adjusted to each other so that even in the largest circle of holes, an exact centering of the substrates is ensured.

To avoid abrasion, it is advisable to provide the finished graphite plates with a protective layer of pyrocarbon which is produced by pyrolyzing gaseous carbon compounds and is very resistant.

The circular plate 1 is secured in a centric position relative to a rotary ring 3 so that the evaporative source 0 comes to be located as close as possible to the point of intersection S of the substrate axes. Close to the circular plate 1, a planar correction screen 4 is provided extending perpendicularly to the common axis of rotation $A_0$. The contour points of the screen may be determined by means of a system of polar coordinates in which the radius vector corresponds to the distance $y_B$ from the axis of rotation $A_0$ and the polar angle corresponds to the opening angle $\omega$. Under the simplifying assumption of an evaporative source of negligible size loated at the origin S of a second system of coodinates having is x-axis identical with the axis of rotation $A_0$, opening angle $\omega$ may be expressly represented as a function of the radius vectory $y_B$ so that, as shown hereinafter, a substantially uniform coating is obtained.

A beam issuing from the last mentioned origin S and passing through a point B of the correction screen contour extending in the plane $x_B$=const, forms with the x-axis a polar angle $$\varphi = \text{arc tan } y_B/x_B. \tag{1}$$

The average beam intensity I varies in proportion to opening angle $\omega$. Consequently, if the beam intensity which, with an opening angle of $\omega=2\pi$ and in a direction given by a polar angle $\varphi$, has a numerical value of $\{I_o\}_\varphi$, is to be reduced by means of the rotating correction screen and under otherwise equal conditions to a numerical value $\{I\}_\varphi$, the polar coordinates of a point of the contour will be as follows:

$$y_B = x_B \cdot \tan \varphi \tag{2}$$

$$\omega = 2\pi \left\{ \frac{I}{I_o} \right\}_\varphi \tag{3}$$

The primary beam intensity $I_o$ is determined by measuring the coating of substrates which have been placed in the centering holes of the substrate support. With the simplifying assumption that a point M of the substrate surface is reached only by beams which form a polar angle $\varphi$ with the x-axis at the original S of coordinates and an angle of incidence $\varphi$ with the normal to the surface at the point M at a distance r, the general relation applies that $$\{I\}_\phi \left\{ \frac{s \cdot r^2}{\cos\theta} \right\}_\varphi. \tag{4}$$

If, in a particular instance, a planar substrate is concerned whose axis passes through the origin of coordinates and whose position is given by the coordinates $x_p$, $y_p$ of the substrate pole P, then, for a surface point M spaced from this pole P by a meridional distance b, the quotient of equation (4) is obtained, in accordance with the known rules of trigonometry, as $$\frac{r^2}{\cos\theta} = \sqrt{\frac{(b^2 + x_p^2 + y_p^2)^3}{x_p^2 + y_p^2}}. \tag{5}$$

and the direction cosine as $$\cos\phi = \frac{x_p - by_p/\sqrt{x_p^2 + y_p^2}}{\sqrt{b^2 + x_p^2 + y_p^2}}. \tag{6}$$

In equation 6, the distance b between the substrate pole P given by coordinates $x_p$, $y_p$ and surface point M determinable by coordinates xy, is to be taken as positive (b→0) if y→$y_p$, and as negative (b←0) if y←$y_p$.

Therefore, with equations (4) and (5), values of the beam intensity $I_0$ can be determined from the values of independent variables $x_p$, $y_p$, b, and dependent variable s, as a function of the direction cosine cos $\varphi$. By plotting them on an orthogonal logarithmic paper, a close to straight line of measured values is obtained. Since the distribution of the beam intensity randomly varies not only from evaporative source to evaporative source, but also from one vapor deposition to the other, it is advisable to repeat the coating of substrates several times, to provide a sufficiently dense distribution of the substrates and of the measured surface points over the utilizable interval of $\varphi$, and to take mean values of a plurality of measurements at identical surface points. If the plotted curve is a straight line, thus the primary beam intensity $I_0$ can be written as a power of the direction cosine $\cos \varphi$, a dependable estimate of the emission exponent k which is determining for the distribution of the vapor emission, is obtained by linear regression of the random variable $Y = \log I_o$ to a limiting quantity $X = \log \cos \varphi$ and by means of the known algorithm of the balancing calculation:

$$k = \frac{n \cdot \Sigma X \cdot Y - \Sigma X \cdot \Sigma Y}{n \cdot \Sigma X^2 - (\Sigma X)^2}, \quad (9)$$

wherein n is the number of associated data x,y. Instead of the function curve, the formula $$I_0 \sim \cos^k \varphi \quad (10)$$

may be used.

While defining the secondary beam intensity I as a function of $\varphi$ in equation (3), it must be taken into account that a uniformity of coating is obtainable only if the same layer thickness is produced all over an assumed spherical surface on which all of the substrate poles are located. However, if all the substrate axes have a common point of intersection S while the substrate poles P are spaced differently therefrom by distance $R_p$, a substantially uniform coating is still obtainable, provided that the same layer thickness is produced in all the assumed spherical zone having different main radii of curvature $R_p$. The pole for each substrate is its central point of intersection of its axis.

Therefore, in accordance with equation (4) and with s=const. and cos=1, the secondary beam intensity I must be constant within each of the spherical zones, however, from spherical zone to spherical zone it must be proportional to the squares of the main radii of curvature $R_p$:

$$\frac{\{I\}_\varphi}{R_p^2} = \text{const.} \quad (11)$$

The primary beam intensity, as a rule, is a monotonously decreasing function of $\varphi$ which, therefore, has its smallest value at the end of the usable interval of $\varphi$. Therefore, within the $\varphi$ interval which extends through the largest circular substrate row having a substrate pole distance of $R_{pmax}$, the secondary beam intensity will be held constant at the value to which the primary beam intensity drops at the interval end $\varphi_{max}$:

$$\{I\}_\varphi = \text{const.} = \{I_o\}_{\varphi max}. \quad (12)$$

To allow for some tolerance, it is advisable to hold the secondary beam intensity at a level the primary beam intensity has close outside the utilizable interval of Then, for an interval $\varphi$ extending over one of the smaller circular rows of substrates at a distance $R_p$ of the substrate poles, equation (11) applies correspondingly:

$$\frac{\{I\}_\varphi}{R_p^2} = \frac{\{I_o\}_{\varphi max}}{R_{pmax}^2}. \quad (13)$$

For a piece by piece construction of the outline of the correction screen, the radius vector $y_B$ to the freely choosable values in individual $\varphi$ intervals, which are adjusted to the respective single circular substrate row having a constant distance $R_p$ of the substrate poles, is obtained from equation (2):

$$y_B = x_B \cdot \sqrt{1 - \cos^2 \varphi} / \cos \varphi \quad (14)$$

and the opening angle from equations (3), (10), (12) and (13):

$$\omega = 2\pi \frac{R_p^2}{R_{pmax}^2} \cdot \left[ \frac{\cos \varphi_{max}}{\cos \phi} \right]^k. \quad (15)$$

At the interval limits, in the transition areas of $\varphi$, the contour has finite jumps.

With convex substrates, the distance $R_p$ of the substrate poles P from the points of intersection S of the substrate axes is smaller, and with concave substrates it is larger, than with planar substrates, namely by the amount of $$|R_p| = R - \sqrt{R^2 - D^2/4}, \quad (16)$$

with R being the main radius of curvature, and D being the diameter of the substrates.

In practice, the coating effected with the described arrangement and correction screen surprisingly does not show any irregularities which might be expected at the margins and would be due to differences in the spacing $R_p$ from the source, of the individual substrate rows. To determine these irrgularities with a satisfactory accuracy, it is advisable to start from equation (4) and, while assuming $\{I\}_\varphi = \text{const.}$, apply the known rulse of trigonometry and the approximation $$\cos \beta \approx 1 - \frac{\beta^2}{2} \cdot \left(1 - \frac{\beta^2}{24}\right)^2 \quad (16)$$

to come to the approximate formula for the proportion to the layer thickness at the substrate pole:

$$s \approx \quad (17)$$

$$\frac{1 - \frac{1}{2} \cdot \frac{R_p}{R} \cdot \left(1 + \frac{R_p}{R}\right) \cdot \frac{b^2}{R_p^2} \cdot \left(1 - \frac{1}{24} \cdot \frac{b^2}{R^2}\right)^2}{\left[1 + \left(1 + \frac{R_p}{R}\right) \cdot \frac{b^2}{R_p^2} \cdot \left(1 - \frac{1}{24} \cdot \frac{b^2}{R^2}\right)^2\right]^{3/2}}$$

In this formula, which is applicable to both spherical and planar substrates, b is again the distance of the surface point from the substrate pole, particularly, if spherical substrates are concerned, the length of the circular arc by which the polar distance $\beta = b/R$ of the surface point is determined.

The numerical value of the curvature 1/R is positive $(1/R \to 0)$, for convex substrates, negative $(1/R \leftarrow 0)$ for concave substrates at 0, $(1/R = 0)$ for planar substrates.

FIG. 3 shows some examples of how this function, and thus coatings produced in accordance with the invention, vary.

Figure 3A:
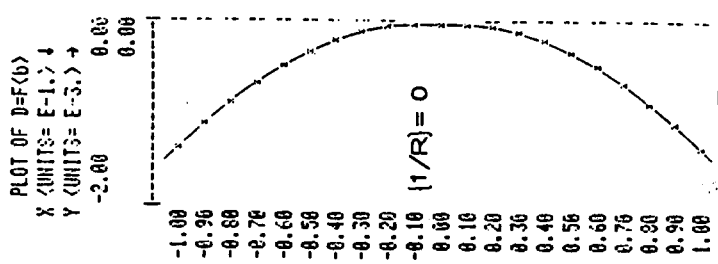
FIGS. 3a to 3d are diagrams showing variations of the thickness of coatings of different spherical and planar substrates, which can be deposited with the arrangement of FIG. 1.
Figure 3B:
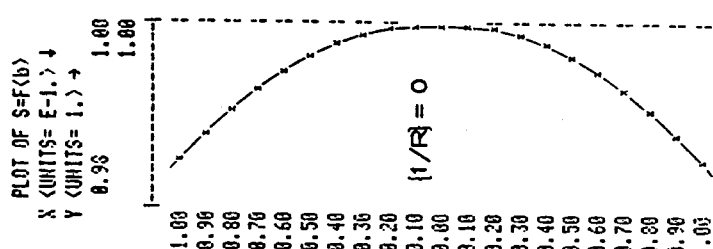

The graph of FIG. 3b shows the layer of thickness s as a function of the pole distance b on planar substrates $(1/R = 0)$, with the layer at the substrate pole being taken as a unit of s and the distance $R_p$ of the substrate pole from the evaporative source being taken as the unit of b. Therefrom it may be learned, for example, that at a pole distance $b=0.09R_p$ the layer thickness is about 99% of that at the pole distance $b=0$.

As compared to substrates which are placed at a distance $R_p$ from the evaporative source which is proportionally larger by the factor 1.05, the layer thicknesses differ, as plotted in FIG. 3a against the polar distance b. For example, at the polar distance $b=0.08R_p$, the difference is about 0.1% of the layer thickness at the polar distance $b=0$.

In spherical substrates ($1/R \neq 0$), the dependency of the layer thickness on polar distance b may be accentuated. The graph of FIG. 3d shows the layer thickness for surface points at the polar distance $b=0.05$ as the function of the curvature $1/R$ of spherical substrates, again with the distance $R_p$ of the substrate poles from the evaporative source taken as a unit of R. Therefrom, it may be learned, for example, that at a pole distance of $b=0.05R_p$, the layer thickness of both concave substrates having a main radius of curvature of $R=R_p/10$, and of convex substrates having a main radius of curvature $R=R_p/7$, corresponds to about 90% of the layer thickness of the pole distance $b=0$.

Figure 3C:
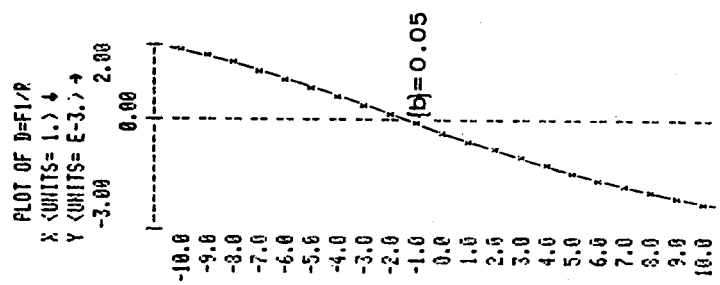
Figure 3D:
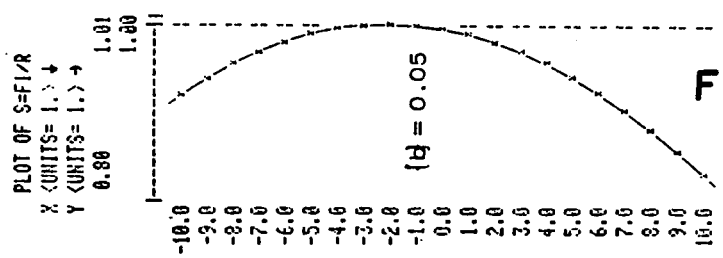

The layer thickness differences relative to identical spherical substrates placed at a distance $R_p$ from the evaporative source which is proportionally larger by the factor 1.05, but at the same pole distance $b=0.05$, are evident from the graph of FIG. 3c. For example, at the pole distance $b=0.05\ R_p$, the difference in layer thickness for both concave substrates with the main radius of curvature $R=-R_p/10$, and convex substrates with the main radius of curvature $R=R_p/7$, is about 0.2% of the layer thickness at the pole distance $b=0$.

Thus, since even with small main radii of curvature the differences in coating from substrate row to substrate row are unimportant and hardly measurable, the coating may be considered uniform in practice.

Figure 2A:
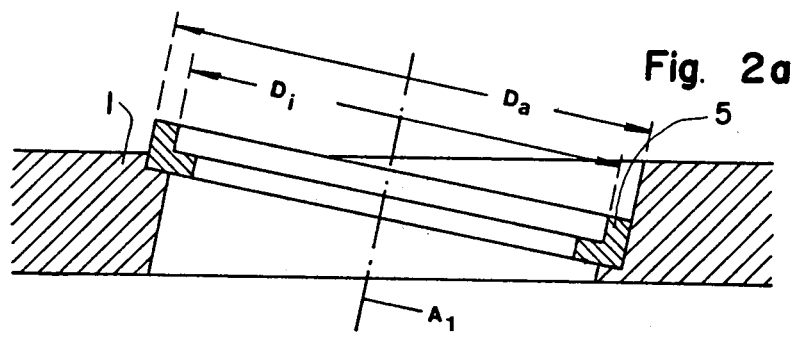
FIGS. 2 to 2d are partial sectional views of different embodiments of holes and substrate holders provided on or in the circular plate.
Figure 2B:
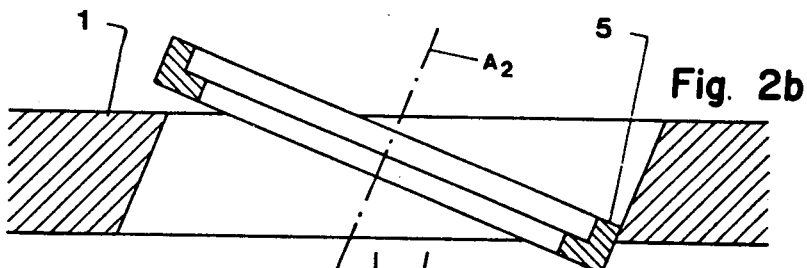
Figure 2C:
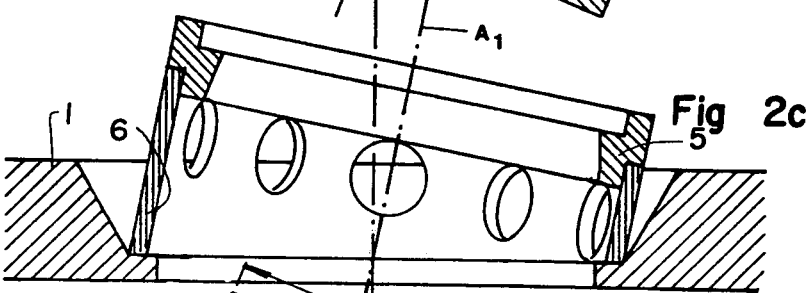
Figure 2B:
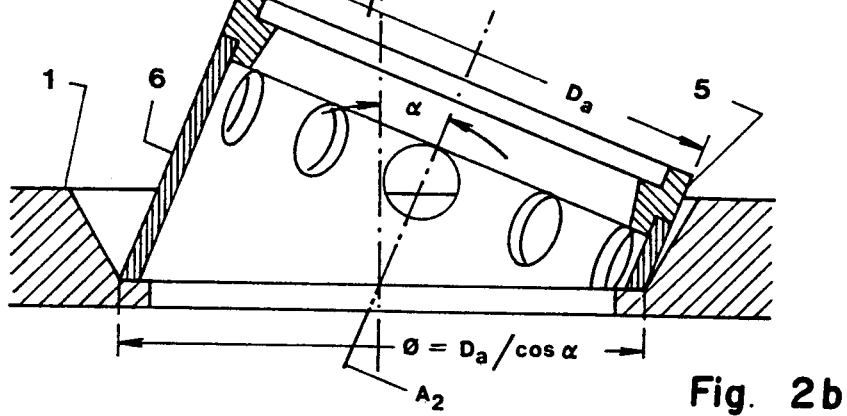

It happens time and again that because of the small number of substrates of the same kind, the capacity of the apparatus for vapor deposition cannot be fully utilized. It would therefore be desirable to be able to treat substrates of different size in a single operation. It would not pay, however, to adapt the holes of the circular plate in every instance to the variety and frequently small number of substrates. Therefore, advantageously and in accordance with FIG. 2a, b circular plate 1 is provided with uniform holes and instead of placing the substrates in the holes directly, they are inserted in annular mounts 5 having an outer diameter $D_a$ corresponding to the uniform hole, and an inner diameter $D_i$ accurately conformed to the respective substrate. By grading the unform holes, an excessive, uneconomical reduction of the useful area may be avoided. The circular plates may also be made from foam carbon blocks. They are produced from plastic foams through pyrolysis, have a very low density (about 0.1 kg/dm³) and substantially an expanded structure, and are easy to machine.

To avoid oblique holes in the circular plate 1, annular mounts 5 may be inserted in obliquely cut tubes 6 which are then centered in, and by, frusto-conical recesses which are provided in regular position in plate 1. The angle of cut $\alpha$ is given by the angle ($\alpha_1$, $\alpha_2$ etc. in FIG. 1) the substrate axes ($A_1$, $A_2$, etc.) form with the axis $A_0$ of the circular plate at their common point of intersection S. Depending on the angle $\alpha$ of the oblique cut and on the diameter $D_a$ of the tube, the smallest diameter $\emptyset$ of the frusto-conical recess is always such that the obliquely cut tube end reposes on the recess bottom without play. The obliquely cut tubes may be secured against rotation and in a position in which the tube axes intersect at a single point S, by means of adjusting keys or pins.

In addition, the length of the obliquely cut tubes may be adjusted to the respective main radius of curvature R of the substrates by applying equation (16), so that the distance $R_p$ of the substrate holes does not vary. In this way, always equal layer of thicknesses can be obtained at the poles of different substrates with the same correction screen.

Further, it is sometimes advantageous to provide the obliquely cut tubes with a number of bores, to prevent the formation of a gas veil during the vapor deposition, which may unfavorably affect the coating.

If, on the contrary, a uniform coating is aimed at, not only the point of intersection S of the substrate axes but also the centers of curvature of identical substrates must coincide at a (any) point on the axis $A_0$. With concave substrates, this point is at the side of the evaporative source (for example, at $S_2$ in FIG. 4), with convex substrates it is at the opposite side of the circular plate, and with planar substrates it is at infinity.

Figure 4:
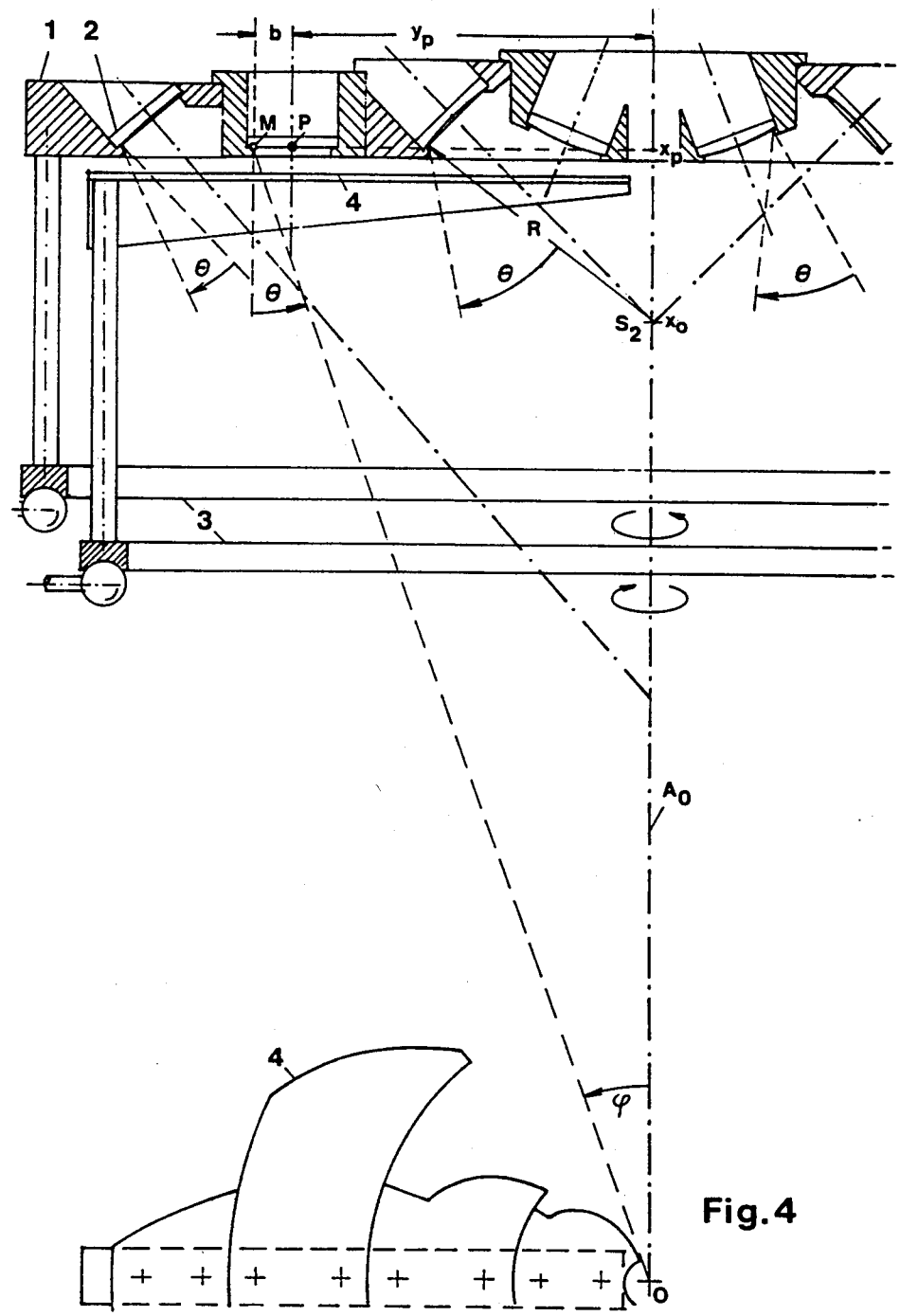
FIG. 4 is a view similar to FIG. 1 of another embodiment of the invention, comprising a circular plate assembled of a plurality of concentric rings, with which an even coating of spherical (concave or convex) and planar surfaces can be obtained.

As shown in FIG. 4, the circular plate may be assembled of concentric fitting rings which may be exchanged as needed. However, the angle of incidence $\theta$ of the vapor beams on the substrates must not exceed a value beyond which the optical or mechanical properties of the coating would change. For this reason, substrates having small main radii of curvature R, particularly convex ones ($R \to 0$), must be placed in the central area (thus at a small distance y from axis $A_0$). In order to utilize the vapor cone fully in spite of that, substrates with large main radii of curvature, primarily concave ones ($R \leftarrow 0$), may at the same time be placed at the periphery (margin) of the circular plate as shown by way of example in FIG. 4. To demonstrate it clearly, large angles of incidence $\varphi$ are shown in FIG. 4.

The radial distance y in plane x of a surface point of the substrate having a main radius of curvature R is implicitly given by the (permissible) angle of incidence:

$$\frac{x}{R} = \frac{x}{y} \cdot \frac{\tan\varphi - y/x}{\sqrt{(1 + \tan^2\varphi)\cdot(1 + y^2/x^2)}}. \qquad (18)$$

Figure 5:
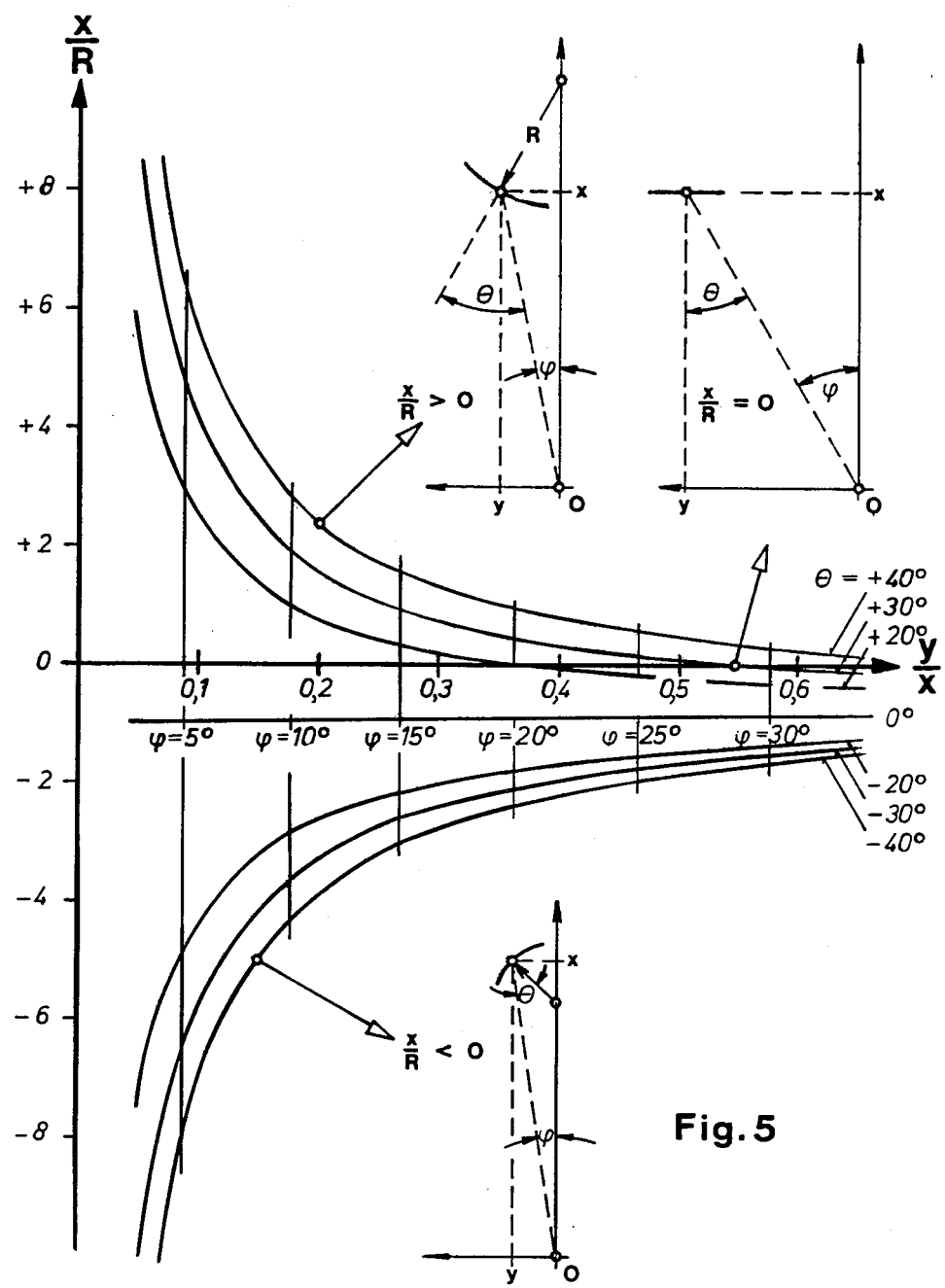
FIG. 5 is a graph representing a mathematical function and diagrams explaining the arrangement of spherical or planar surfaces to be coated evenly.

FIG. 5 illustrates this function for angles of incidence $\varphi = 20°$, $30°$, $40°$. The associated values $x/R$ and $y/x$ in the grey zone correspond to angles of incidence $\varphi$ smaller than $40°$. Therefore, the distance y given by the permissible angle of incidence $\varphi = 40°$ on convex substrates ($R \to 0$) or concave substrates ($R \leftarrow 0$) may be learned.

The planar correction screen 4 again extends close to the circular plate. To construct the contour line thereof, first the primary beam intensity $I_o$ is determined by measuring the coating of planar substrates which are arranged in the plane at a distance $x_p$ from the evaporative source. 0. Since the angle of incidence $\varphi$ and the angle of emission $\varphi$ are equal to each other in this instance, the following equations are obtained instead of equations (5) and (6) for a surface point given by the coordinates $x_p$, $y_p$ of the substrate pole and the distance b in the radial direction:

$$\frac{r^2}{\cos\varphi} = x_p^2 \cdot [1 + (b + y_p)^2/x_p^2]^{3/2} \qquad (19)$$

and $$\cos\varphi = 1/\sqrt{1 + (b + y_p)^2/x_p^2} \qquad (20)$$

With the aid of equations (4), (19) and (20), and by measuring the coating, values of the beam intensity $I_0$ may be obtained as a function of the direction $\cos\varphi$ and as described represented by a curve, or by formula (10).

To obtain polar coordinates of leading points of the contour of a correction screen for a uniform coating of spherical substrates, first a numerical value of $\varphi$ is chosen within the interval provided for the substrate, and the radius vector $y_B$ is computed from equation (14) and the opening angle according to the formula $$\omega \text{ prop.} \frac{[x_o \cdot \cos\varphi - R \cdot \sqrt{1 - (x_o/R)^2 \cdot \sin^2\varphi}\,]^2}{\sqrt{1 - (x_o/R)^2 \cdot \sin^2\varphi}} \cdot \left[\frac{1}{\cos\varphi}\right]^k \qquad (21a)$$

In this formula, R is the radius of the spherical surface to be coated, which, as agreed, is positive for convex substrates and negative for concave ones, and $x_o$ is the distance from the evaporative source to the center of the sphere, which is positive at the side facing the substrates, and negative at the opposite side.

For a uniform coating of planar substrates, the following formula applies instead of (21a):

$$\omega \text{ prop. } x_p^2 \cdot \left[\frac{1}{\cos\varphi}\right]^{3+k} \qquad (21b)$$

While specific embodiments of the invention have been shown and described in detail to illustrate the application of the principles of the invention, it will be understood that the invention may be embodied otherwise without departing from such principles.

What is claimed is:

1. An arrangement for coating substrates in an apparatus for vacuum deposition, comprising a rotatable substrate holding structure, means supporting said holding structure for rotation about a rotational axis, at least one evaporative source provided close to said rotational axis, a vapor beam correction screen located between said evaporative source and said holding structure, supporting means supporting said vapor beam correction screen for rotation in an opposite direction about the same rotational axis, said holding structure comprising a circular plate provided with holders for substrates located such as to hold said substrates in discreet circular rows around the rotational axis, each with their axes positioned in a singular circular row which intersect the axis of rotation, said point of intersection of the substrate axes with the axis of rotation coinciding with the center of curvature of said substrates.

2. An arrangement for coating substrates in an apparatus for vacuum deposition, comprising a rotatable substrate holding structure, means supporting said holding structure for rotation about a horizontal axis, at least one evaporative source provided close to said rotational axis, a vapor beam correction screen located between said evaporative source and said holding structure, supporting means supporting said vacuum beam correction screen for rotation in an opposite direction about the same rotational axis, said holding structure comprising a circular plate provided with holders for substrates located such as to hold said substrates in discrete circular rows around the rotational axis, each with their axes positioned in a singular circular row which intersect the axis of rotation, each substrate having a central point of intersection from which the axis of each substrate extends normally, and the distance between the central point of intersection of each substrate in a singular circular row, and said axis of rotation being different for each circular row.

* * * * *